(12) United States Patent
Boylan et al.

(10) Patent No.: US 6,778,405 B2
(45) Date of Patent: Aug. 17, 2004

(54) POWER MODULE ADAPTER

(75) Inventors: Jeffrey Boylan, Richardson, TX (US); Carl Milton Wildrick, Parker, TX (US); Gordon K. Y. Lee, Plano, TX (US)

(73) Assignee: Innoveta Technologies, Plano, TX (US)

(*) Notice: Subject to any disclaimer, the term of this patent is extended or adjusted under 35 U.S.C. 154(b) by 0 days.

(21) Appl. No.: 09/964,151

(22) Filed: Sep. 25, 2001

(65) Prior Publication Data

US 2003/0058628 A1 Mar. 27, 2003

(51) Int. Cl.$^7$ ............................ H05K 7/06
(52) U.S. Cl. ............... 361/767; 361/772; 361/782; 361/783
(58) Field of Search .............. 361/91.1, 767–771, 361/777–779, 782, 783–785, 790, 791, 803, 772; 257/664, 691, 698, 700, 723, 724, 728, 786; 333/33, 247; 324/765; 363/144, 146, 147

(56) References Cited

U.S. PATENT DOCUMENTS

| 3,719,860 A | * | 3/1973 | Lawrence ............... 361/703 |
| 5,075,821 A | * | 12/1991 | McDonnal ............... 165/185 |
| 5,694,297 A | * | 12/1997 | Smith et al. ............. 361/785 |
| 5,923,176 A | * | 7/1999 | Porter et al. ............ 324/754 |
| 6,265,952 B1 | | 7/2001 | Kan ........................ 333/33 |
| 6,366,467 B1 | * | 4/2002 | Patel et al. .............. 257/691 |
| 6,384,492 B1 | * | 5/2002 | Iversen et al. ........... 257/691 |
| 6,525,944 B1 | * | 2/2003 | Li ........................... 361/767 |

* cited by examiner

Primary Examiner—John B. Vigushin
(74) Attorney, Agent, or Firm—David W. Carstens; Carstens Yee & Cahoon, LLP

(57) ABSTRACT

The adapter couples a power module to a circuit board. An adapter embodying the present invention can be configured to allow the connection of any power module regardless of pin out to any circuit board. Signal modifying circuitry can also be added to the adapter to enhance or simply modify the signal to the end user's circuit board. The modifying circuitry can act on either the input to the adapter or the output from the adapter. At least one conductive path couples the input interconnects and the output interconnects.

13 Claims, 5 Drawing Sheets

POWER MODULE ADAPTER

BACKGROUND OF THE INVENTION

1. Technical Field

The present invention relates to an adapter board, and specifically to an adapter board that can be used to allow the pin-out of a replacement power supply to match the pin placement of an end user circuit card. The adapter board can also include circuitry to improve the quality of the signal transferred between the power module and the end user circuit card.

2. Description of Related Art

Distributed power architecture anticipates the use of multiple power supply modules that are connected to the specific circuit cards requiring the power. The card requiring the power can have a plurality of specifically placed contact pads. A power supply is mounted to the pads as using a solder paste. The assembly is then subjected to heat that melts the solder paste. Upon cooling the solder paste hardens thus coupling the power supply to the circuit card.

As with most electrical components and electrical subassemblies, end users of power supplies may purchase commodity power supplies from multiple vendors. For example, several companies may sell a 48 Vdc to 3 Vdc power converter. However, the pin placement for the various power converters may not adequately match those on the end user's card. In other words, the input, output and control signal pins may not be physically located in the same positions as their corresponding contact pads on the end user's circuit card. Thus, these non-conforming power supplies cannot be coupled directly to the end user's circuit card. A need exists for an adapter board that allows an end user to purchase a non-conforming power supply and effectively couple it to his circuit card. It should allow for effective current transition paths from the power modules pins to the card's contact pads. One attempt at creating an adapter card is disclosed in U.S. Pat. No. 6,265,952 entitled "Adapter for Surface Mounted Devices." FIG. 1 provides an exploded view of the adapter disclosed in the '952 patent. In general, the adapter is directed to a surface mount device that includes a plurality of matched impedance input/output lines for connecting the surface mount device to a plurality of through hole pins. The adapter may be connected to a motherboard or other prototyping board for testing or prototyping the surface mount device. The adapter includes a printed circuit board having a top layer and bottom layer, and a footprint formed on the top layer of the printed circuit board for receiving the surface mount device. Impedance matching input/output lines are connected between a plurality of electrical pins of the surface mount device and a plurality of through hole pins attached to the printed circuit board.

FIG. 1 is an exploded view of an adapter 10 in a first embodiment. The adapter 10 includes a multi-layer printed circuit board (PCB) 14. The PCB 14 includes a top layer 12, a power layer 24, a ground layer 22, and a bottom layer 16. The power layer 24 is optional. Layers 12, 16, 22, and 24 may be secured in a conventional manner. The power layer 24 may be formed onto the layer 12 or on the bottom layer 16. Further, individual ground layers can be formed on the top layer 12 or the bottom layer 16. The PCB 14 may be molded from non-conductive high impedance material. For example, the PCB 14 may be formed from plastics, polymer, or resins. The top layer 12 includes a footprint for receiving an electrical component 50, such as a surface mount device. The electrical component 50 may be a gigahertz surface mount device. The footprint includes a plurality contact areas 20 for receiving a plurality of electrical leads or pins 55 extending from the bottom of electrical component 50. The electrical leads 55 and the electrical component 50 are secured to the contact areas 20 and footprint, respectively, by soldering or other suitable means.

FIG. 1 illustrates that each of the electrical contacts 20 is electrically connected to a corresponding pad by through hole pin assembly 70 via an input/output line 26. Each input/output line 26 is used to control the impedance of each component pin 55 to match the impedance of the electrical component 50. The input/output line 26 may be a 50 ohm transmission line or other suitable transmission line. This means that high frequency signals can be used to operate the electric component without excessive noise.

The through hole pin assembly 70 includes a through hole pin 75 and a clamp 78. The clamp 78 includes a top portion 78a and bottom portion 78b. The adapter 10 may include any number of pins 75 to secure the adapter 10 to a motherboard or prototyping board. The adapter 10 may have pins 75 dedicated to power and ground connections. Accordingly, these pins may be connected directly to planes 22 and 24. This means that no long wire traces need to be employed to connect the component to the power and/or ground connections on the motherboard as in known systems. The ground plane 22 and the power plane 24 may be connected to selected pins corresponding to power and ground pins on the electrical component 50. The ground and power planes 22 and 24 may be connected to the pins 55 or 75 using short electrical traces.

While FIG. 1 shows a simple adapter, this adapter does not provide any signal enhancement elements that could be used to improve the overall performance of the devices or to compensate for any noise introduced by the adapter. Therefore, a need exists for an improved adapter that can carry the higher current load associated with power modules and also one that has circuitry to reduce noise or otherwise enhance the signal from the power module to the end user's circuit card.

SUMMARY OF THE INVENTION

The present invention provides an adapter for coupling a power module with a first pin configuration to an end user's circuit card having a second pin configuration. The power module can be a DC-to-DC converter or an AC-to-DC converter or any other sort of power module. Additional components may be added to the adapter to improve performance, add features and result in a better match for existing equipment. The adapter can have a first surface and a second surface. The first surface can be populated with a first set of interconnects, while the second surface can be populated with a second set of interconnects.

The power module has a first pin configuration that engages the first set of interconnects. Further, the end user circuit board has a second pin configuration that engages the second set of interconnects of the adapter. Between the first and second set of interconnects are circuit paths that provide the appropriate connectivity between the power module and the circuit board.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE INVENTION

Figure 1:
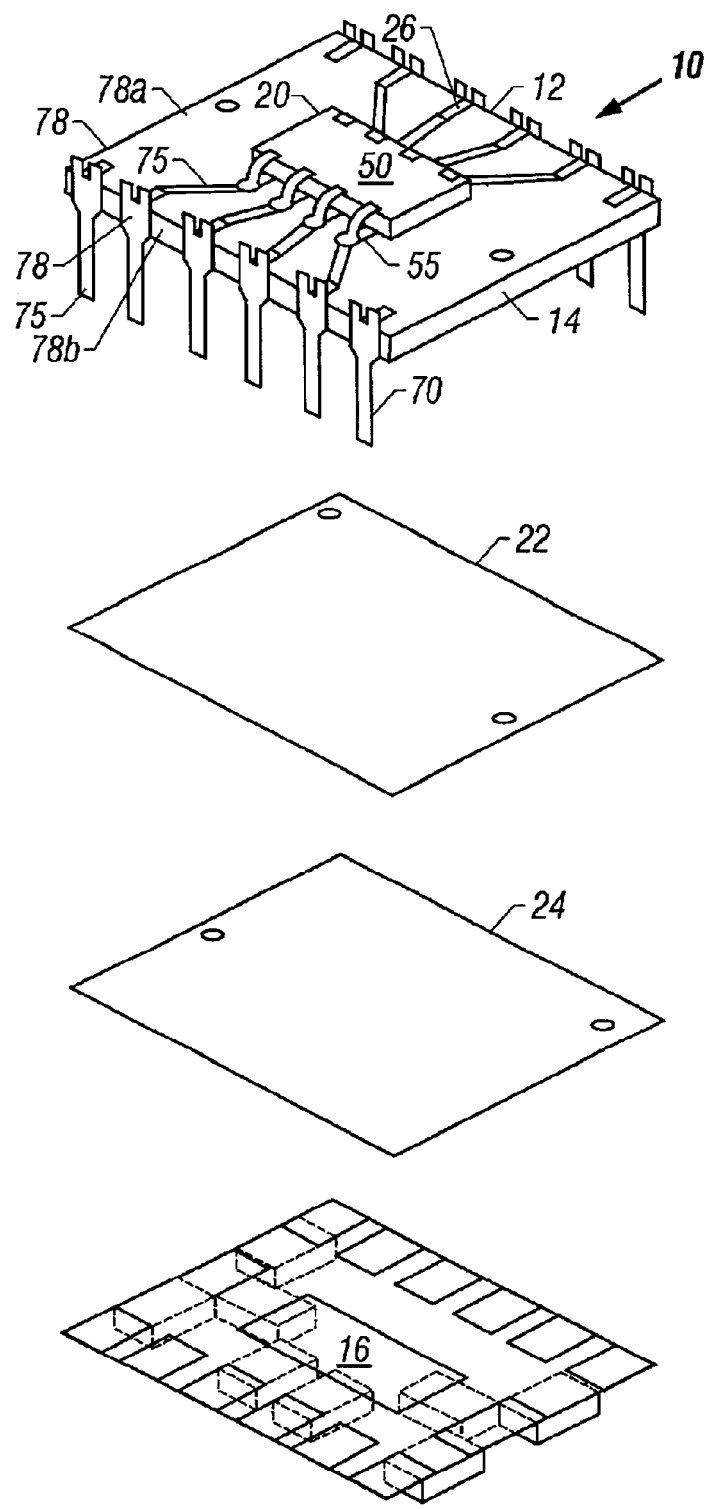
FIG. 1 is an exploded view of a prior art adapter used for testing or prototyping circuit elements onto a motherboard.
Figure 2:
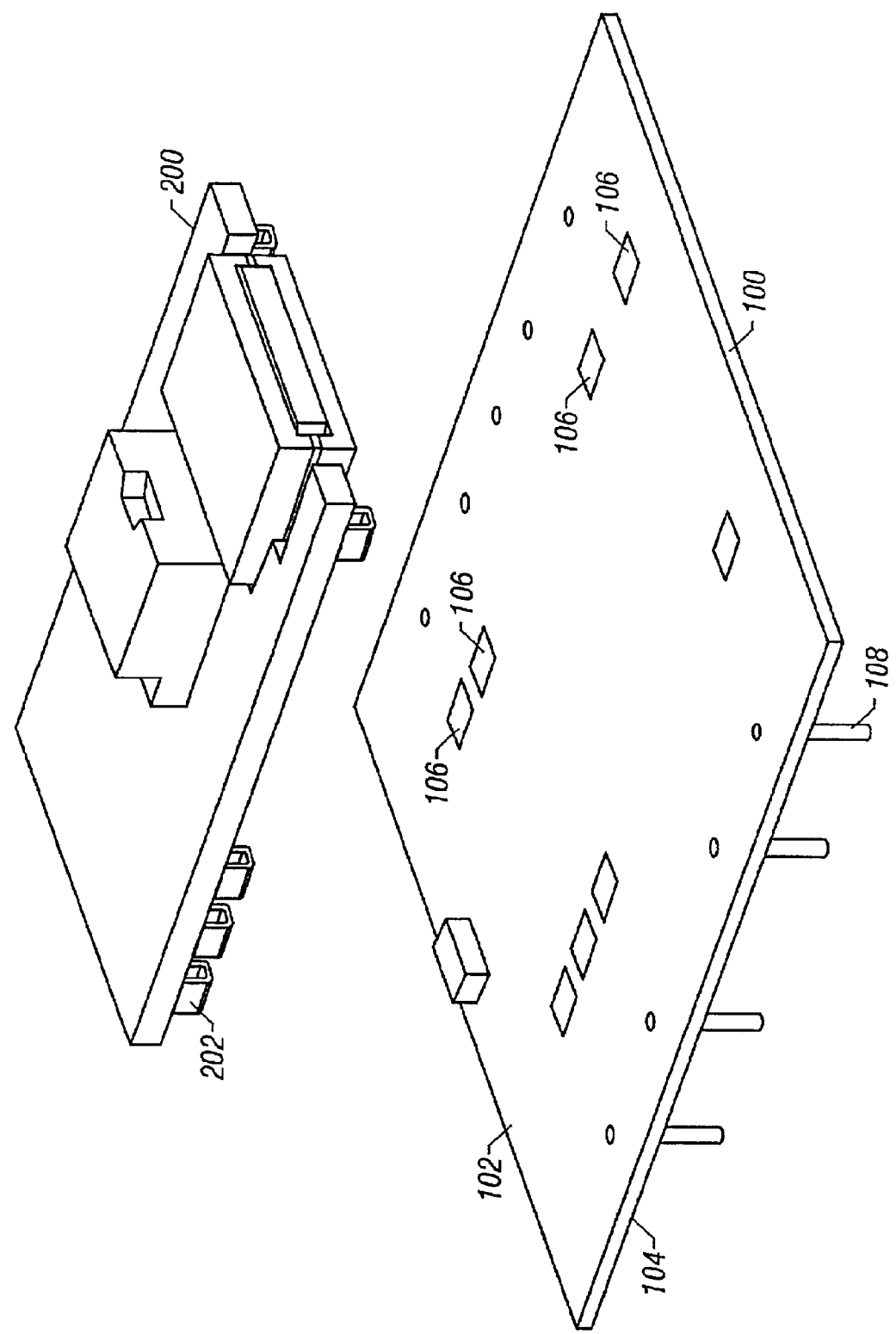
FIG. 2 is an exploded view showing a power module that has a pin configuration that matches the end user board.

FIG. 2 is an illustration of a power module adapter 100 in accordance with the present invention. Adapter 100 has a first side 102 and a second side 104. A first set of interconnects 106 are located on first side 102, while a second set of interconnects 108 are located on side 104. In one embodiment, a power module 200 can be coupled to the adapter 102. For example, interconnects 106 can be conductive pads. A solder paste can be placed on the conductive pads, and the interconnects 202 on the power module 200 can be placed thereon. Heat can be applied thereby melting the solder paste. Once cooled, the solder electrically couples the power module to the adapter 100. Of course, surface mount technology is simply one option. The power module 200 could also be coupled to the adapter 100 by through hole pins. One skilled in the art could anticipate other suitable means for connection. A plurality of conductive paths exist between the first interconnects 106 and the second interconnects 108. Thus, for example, a power module output can be extended to a physical location on the adapter 100 so it aligns with an input on an end user's board 300 shown in FIG. 3.

Figure 3:
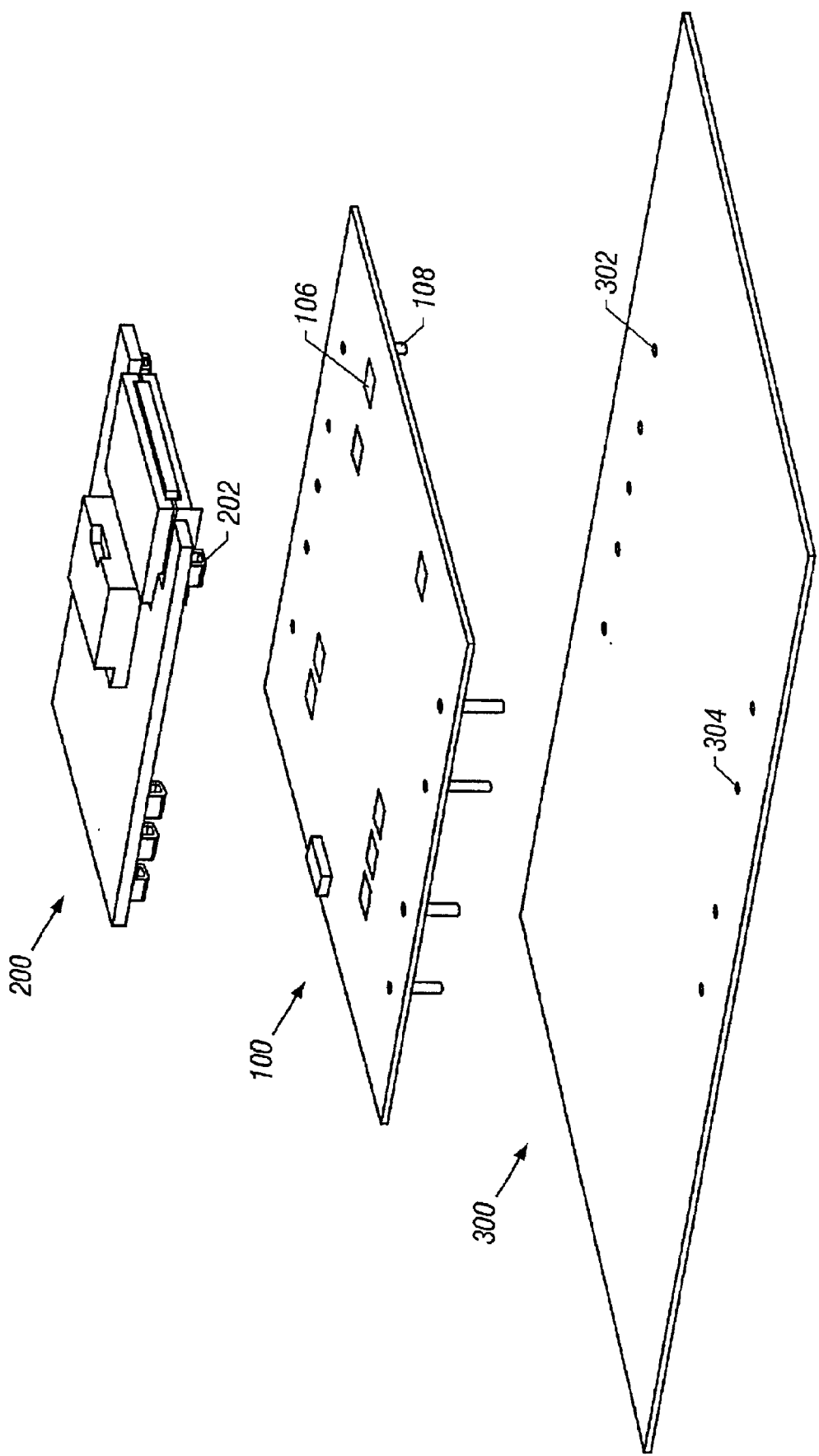
FIG. 3 is an exploded view of a power module engaging an adapter embodying the present invention.
Figure 4:
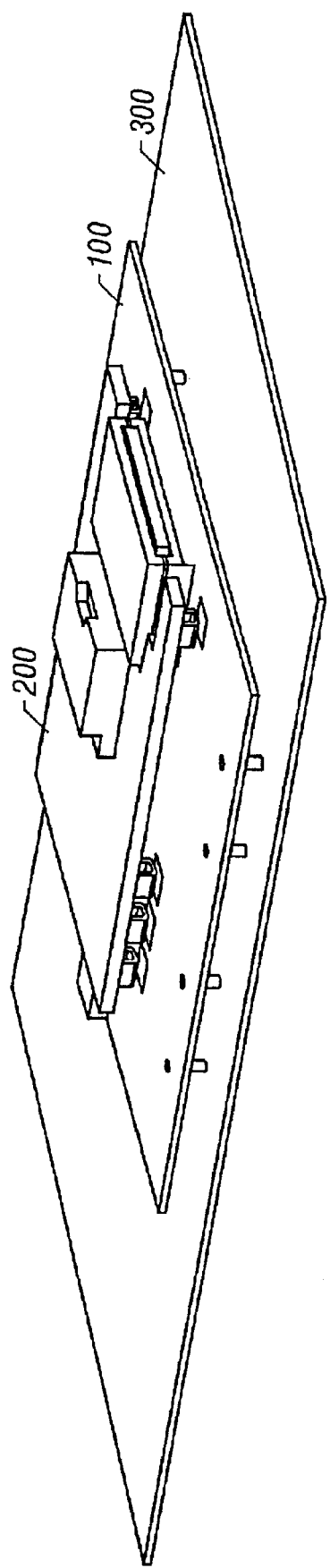
FIG. 4 is an exemplary illustration showing the assembly of a power module, adapter, and end user circuit board.

Once attached to the adapter, the power module 100 can be coupled to the end user's board. The adapter 100 must be specifically designed so that its interconnects 108 on side 104 are physically situated to engage a pin configuration 302 on the end user's circuit board 300. FIGS. 3 and 4 illustrate this situation. Specifically, a unique adapter design provides for the ability to match a power supply 200 to an end user circuit card 300. In this illustration, the adapter even allows for the connection of a surface mount power module to a through hole pin board 300. This greatly increases the number of commodity power modules that could be paired with a customer's existing board design. This saves the end user from having to redesign his board in the event that an original power module is no longer available.

Figure 5:
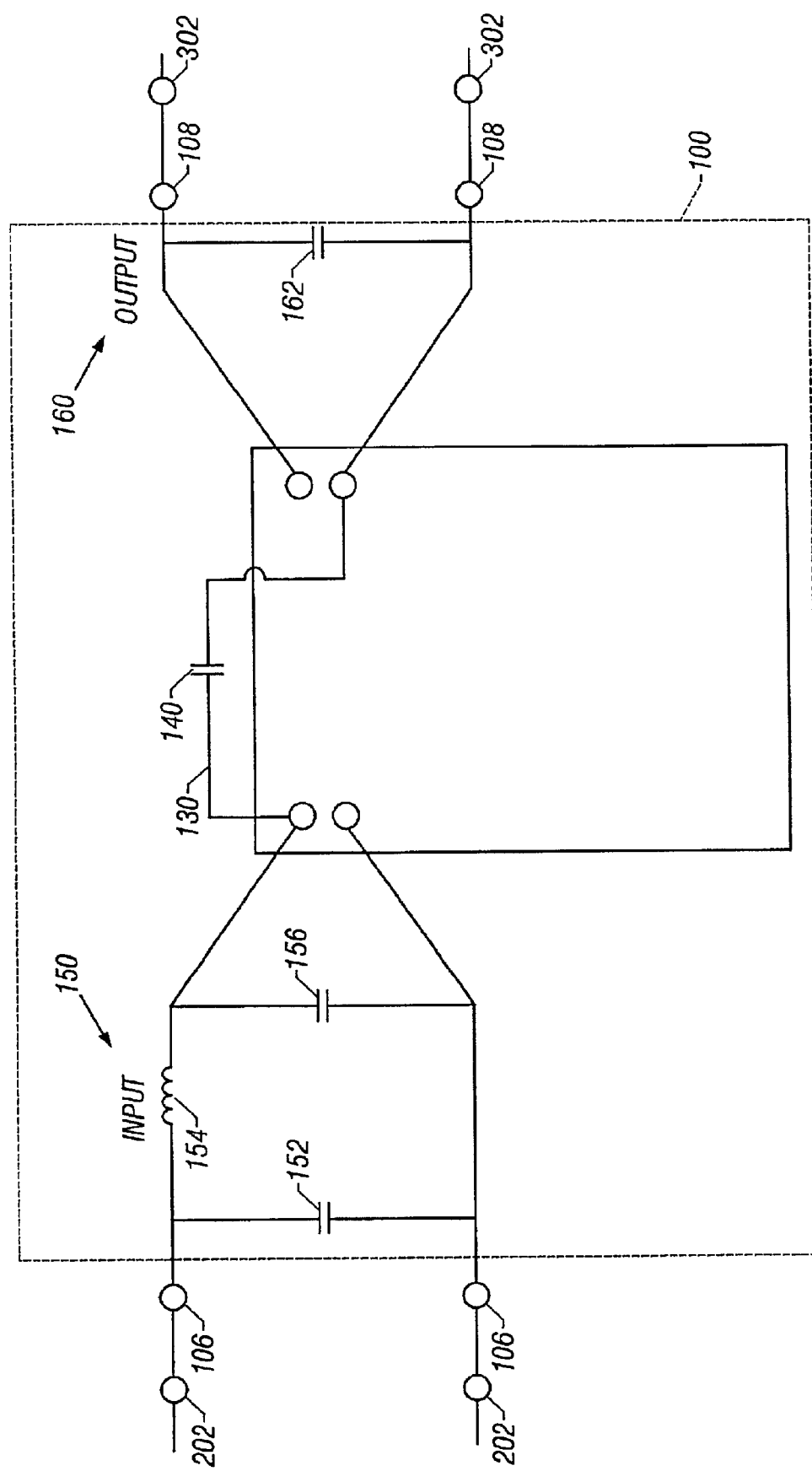
FIG. 5 is an exemplary filtering configuration for signal enhancement to the adapter.

FIG. 5 illustrates the use of specific circuitry to modify the signal between the power modules pins 202 and the end user's card pins 302. An input 150 on the adapter 100 can be modified, for example, by the filter configuration shown. A pair of capacitors 152, 156, in conjunction with inductor 154 form a simple LC filter. Based on the values of the components, the effectiveness of the filter can be modified. Likewise, the output 160 from the adapter can be modified before reaching the inputs 302 for the end user card. In one embodiment, a capacitor 162 can be used to modify the signal. A conductive path 130 within the adapter 100 connects at least one of the first interconnects 106 to at least one of the second interconnects 108. As discussed above, the second interconnect 108 can be located at any position on the second side of the adapter 100. In other words, a key element of the present invention is that the second interconnects 108 do not have to be directly opposite to the first interconnects 106. Indeed, in one embodiment of the present invention, multiple first interconnects 106 can be coupled to multiple second interconnects 108. Likewise, in another embodiment, multiple first interconnects 106 can be connected to a single second interconnect 108.

Therefore, the present invention provides a new and unique power supply adapter board which can provide a small, high power density footprint with a minimal amount of design effort in which will be configured to be readily mounted on existing equipment without modification of the equipment or a change in pin configuration. In addition, the power supply adapter board may contain components which improve noise and electromagnetic interference performance of the adapter and the electrical equipment as a whole. Input filtering, common mode filtering and output filtering may be used in conjunction with the power adapter board to improve the characteristics of an overall configuration. In addition, output filtering may provide improved response of the resulting circuitry. This filtering may be accomplished by components, for example inductors, capacitors and the like. These components may be configured in an unlimited array of configurations to provide performance enhancement for a power supply circuit.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

We claim:

1. An adapter comprising:
   (a) a first and a second surface;
   (b) at least one first interconnect on the first surface;
   (c) at least one second interconnect on the second surface, the at least one second interconnect comprising a through hole connect;
   (d) at least one connective path between the first and second interconnects;
   (e) a signal modifying circuit between the first interconnect and the second interconnect;
   (f) at least a second interconnect on the second surface;
   (g) at least one connective path between the first interconnect on the second surface and the second interconnect on the second surface; and
   (h) a signal modifying circuit between the first interconnect on the second surface and the second interconnect on the second surface.

2. The adapter of claim 1 wherein the at least one first interconnect is physically spaced to correspond to a first pin configuration of a power module.

3. The adapter of claim 2 wherein the power module is a DC-to-DC converter.

4. The adapter of claim 2 wherein the power module is an AC-to-DC converter.

5. The adapter of claim 2 wherein the power module is a DC-to-AC inverter.

6. The adapter of claim 1 wherein the at least one second interconnect is physically spaced to correspond to a second pin configuration of an end user's circuit board.

7. The adapter of claim 1 wherein a signal modifying circuit acts upon an input to the adapter.

8. The adapter of claim 1 wherein a signal modifying circuit acts upon an output to the adapter.

9. The adapter of claim 1 wherein the first interconnects comprise surface mount connects.

10. The adapter of claim 1 wherein the first interconnects comprise through hole connects.

11. The adapter of claim 1 wherein the signal modifying circuit comprises a filter.

12. The adapter of claim 1 wherein the signal modifying circuit comprises an overvoltage protection device.

13. The adapter of claim 1, further comprising:

(a) at least a second interconnect on the first surface, (b) at least one connective path between the first interconnect on the first surface and the second interconnect on the first surface, and (c) a signal modifying circuit between the first interconnect on the first surface and the second interconnect on the first surface.

* * * * *